United States Patent [19]

Chen et al.

[11] 4,125,427
[45] Nov. 14, 1978

[54] METHOD OF PROCESSING A SEMICONDUCTOR

[75] Inventors: Peter C. Chen; John K. Stewart, Jr., both of West Carrollton, Ohio; Tuh-Kai Koo, Escondido, Calif.

[73] Assignee: NCR Corporation, Dayton, Ohio

[21] Appl. No.: 718,291

[22] Filed: Aug. 27, 1976

[51] Int. Cl.$^2$ .......................................... H01L 21/312
[52] U.S. Cl. ..................... 156/657; 29/571; 29/580; 156/659; 156/662; 252/79.3
[58] Field of Search ................... 29/571, 580; 156/8, 156/11, 13, 17, 650–655, 657, 659, 662; 252/79.3; 427/86, 88, 93, 95; 357/41, 53, 59

[56] References Cited

U.S. PATENT DOCUMENTS

| | | | |
|---|---|---|---|
| 3,122,817 | 3/1964 | Andrus | 156/17 X |
| 3,811,975 | 5/1974 | VanLierop et al. | 156/13 |
| 3,847,690 | 11/1974 | Campbell et al. | 29/580 X |
| 3,852,104 | 12/1974 | Kooi et al. | 29/571 X |
| 3,909,325 | 9/1975 | Church et al. | 156/662 |

*Primary Examiner*—William A. Powell
*Attorney, Agent, or Firm*—J. T. Cavender; Lowell C. Bergstedt; Philip A. Dalton, Jr.

[57] ABSTRACT

An improvement of the prior art method of processing large scale integrated (LSI) semiconductors is disclosed, wherein an etching procedure, which was previously performed as the final processing step, is now done at an earlier stage to preclude damage to the surface of the wafer on which the active devices are formed. In the prior art method of fabricating an active device on a semiconductor wafer, an undesirable layer of field oxide manifests itself on the reverse side when the field oxide is grown on the obverse or principal side of the wafer. The prior processing philosophy was to allow the oxide layer to remain on the wafer until after the processing was completed and, as a final step, the undesired oxide coating was removed. This was done by carefully placing the wafer in a pool of etchant so that only the reverse side is etched. Since the wafer is only about 12 mils thick, the operator had to exercise extreme caution in placing the wafer in the etchant to prevent the etchant from creeping up the thickness dimension of the wafer and thus etching the obverse side. Our novel method contemplates modifying the processing steps of the prior art by removing the undesired field oxide before the circuits or active devices have been completely formed, when the wafer may be completely immersed in the etchant without damaging or etching areas on the active portion of the wafer.

4 Claims, 1 Drawing Figure

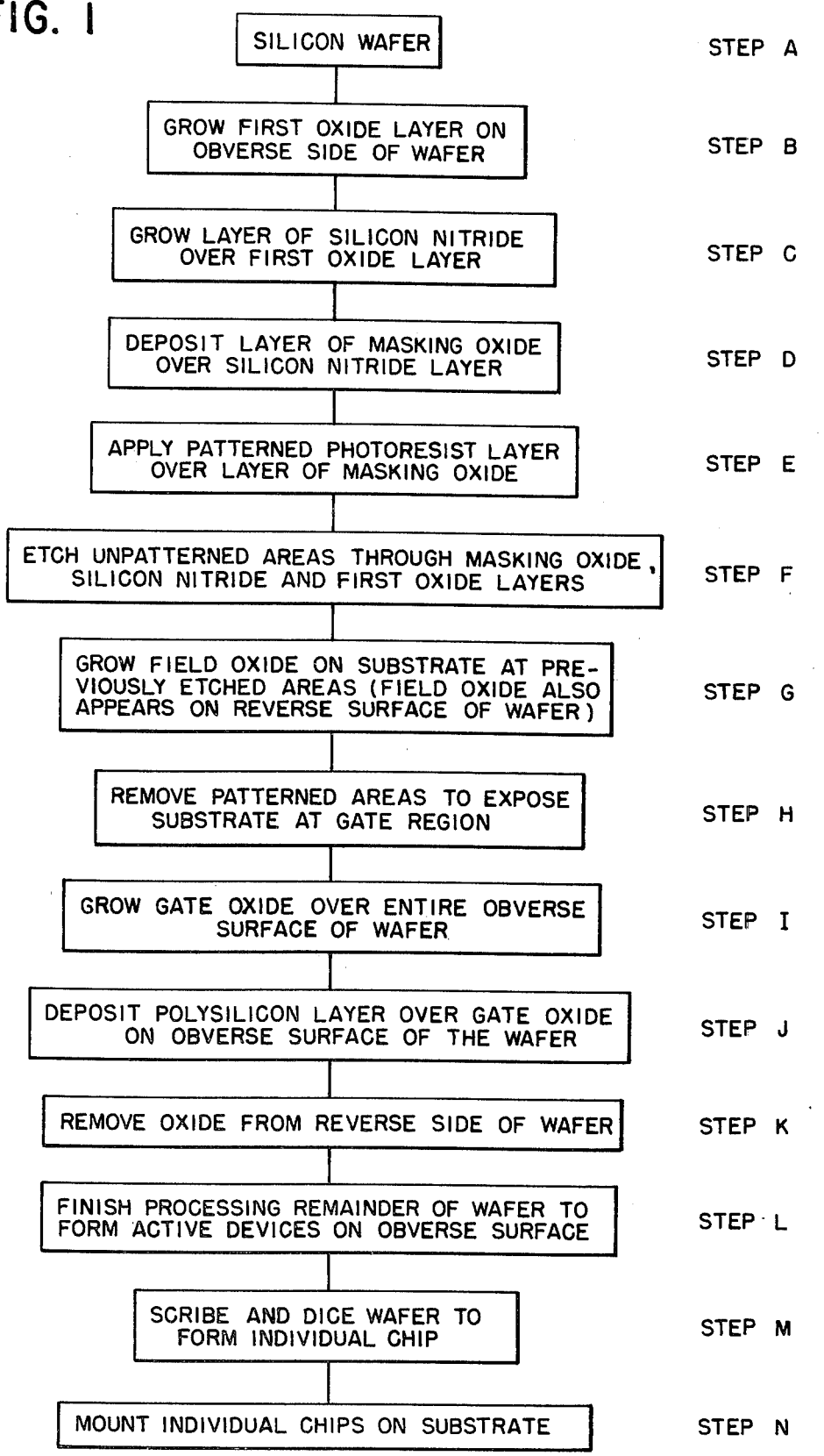

METHOD OF PROCESSING A SEMICONDUCTOR

BACKGROUND OF THE INVENTION

1. Field of the Invention

This invention relates in general to LSI semiconductor processing and, in particular, to an improved method of processing monolithic integrated circuits having discrete circuit components formed on the obverse side of a common substrate.

As used herein, the expression "monolithic integrated circuits" refers to a single substrate or wafer of semiconductor material, typically monocrystalline, on (or in) which individual active and/or passive circuits are formed which, when appropriately interconnected, result in either a desired network or circuit.

2. Description of the Prior Art

In one co-pending application, assigned to the same assignee as the subject application, filed June 2, 1975, Ser. No. 579,332, now abandoned, there is described a method of forming an n-channel boron-doped polysilicon gate semiconductor device. In that application, the obverse side of a semiconductor substrate wafer is first provided with a layer of silicon dioxide. Thereafter, a silicon nitride layer is placed over the silicon dioxide layer followed by a masking oxide layer which is formed over the silicon nitride layer. A photoresist mask is then placed over the masking oxide layer, after which the masking oxide layer is etched and the unetched masking oxide is used as a mask to etch the silicon nitride-silicon dioxide layers that remain unmasked. The masked areas of the substrate are thus utilized to form the gate areas. The next step of the process requires growing a field oxide on the exposed substrate area after which the now masked portion of the silicon nitride and silicon dioxide is removed to expose the gate area. However, it is this field oxide that is undesirably formed on the reverse side of the substrate.

As a first step toward forming the gate, a gate oxide then is grown over the entire wafer. The remainder of the processing is then continued and additional layers are then either grown or deposited to form the integrated circuit. At the conclusion of the processing of the wafer, and just prior to its being scribed and diced to form the individual chips, the oxide is removed by the previously described process step of placing the reverse side of the wafer in a pool of etchant.

In the above prior art process, after having deposited the gate oxide on the observe side of the wafer, it will be noted that the thickness of the field oxide that has also formed on the reverse side thereof has been increased slightly. However, it should be stated that, in certain instances, the presence of an oxide on the reverse side of the wafer represents no problems. However, when it is imperative to make electrical contact to the substrate, or it is necessary to maintain the substrate at a given reference potential, good engineering practices dictate that contact to the substrate be made on the reverse side in order to conserve space on the obverse side. Accordingly, it becomes necessary to remove the oxide on the reverse side. We propose removing this oxide before the wafer is completely processed so that, after it is scribed and diced the individual chips will provide good electrical contact to the base on which it is mounted.

To accomplish the removal of the field oxide grown on the back of the wafer, the following prior art etching procedure is frequently utilized:

(1) a 1:1 aqueous solution of hydrofluoric acid is poured into a ribbed, plastic Petri dish until the liquid level of the hydrofluoric acid just reaches and flows over the tops of the ribs to form a continuous pool of etchant at the center of the dish;

(2) the dish is then carefully levelled to be certain that the hydrofluoric etchant is maintained at the same level over the entire surface of the dish;

(3) using tweezers the operator very carefully places the wafer in the dish so that only the back or reverse side of the wafer is in contact with the liquid in the dish; and (4) after an appropriate period of time, determined by the thickness of the oxide on the back of the wafer, the wafer is again very carefully removed from the Petri dish and washed. The wafer is now prepared for scribing and dicing operations to separate the individual chips on the wafer and for the subsequent mounting and affixing of the necessary wires thereto. It should now be obvious that if there is too much acid in the dish, when a wafer is placed therein, the acid will overflow onto the top of the wafer and etch the completed circuits on the obverse side thereof. Conversely, if the operator has put an insufficient amount of acid in the dish, the reverse side of the wafer will not be etched and the oxide will not be removed. In either event, the result will be an inoperative chip since on the one hand the device is destroyed and, on the other hand, remaining or unetched oxide will act as an insulator preventing a proper electrical contact from being made to the back of the chip.

SUMMARY OF THE INVENTION

Briefly, and in accordance with the present invention, a semiconductor wafer is processed to the point where the field oxide has been grown on the obverse side of the wafer (and undesirably on the reverse side), and the gate oxide is grown on the obverse side in the usual manner followed by the deposition of a layer of polysilicon over the field oxide on the obverse side. It has been found that it is particularly advantageous to remove the unwanted oxide on the reverse side of the wafer at this point in time, because the entire wafer may now be immersed in weak hydrofluoric acid and the hydrofluoric acid will not attack the polysilicon layer.

It is, therefore, a principal object of the present invention to provide an improved method for fabricating integrated circuits on a semiconductor wafer.

An additional principal object of the present invention is to provide an improved method for fabricating substrate circuits on a semiconductor wafer wherein the productivity and yield of finished chips is greatly enhanced due to the fact than an etching process, after the circuits have been formed, has been deleted.

The features of our invention which we believe to be novel are set forth, with particularity, in the appended claims. Our invention itself, however, both as to its organization and method of operation, together with further objects and advantages thereof, may best be understood by reference to the following description taken in conjunction with the accompanying drawing.

DESCRIPTION OF THE DRAWING

The FIGURE is a flow chart indicating the sequence of processing steps, including our invention, for minimizing etching damage to a semiconductor wafer.

DESCRIPTION OF THE PREFERRED EMBODIMENT

While the foregoing exegesis will be described in terms of processing an N-channel polysilicon gate semiconductor device, it will be obvious to those skilled in the art that various other semiconductor processing methods may utilize our invention.

Referring now to FIG. 1 for a typical sequence of steps for fabricating a semiconductor device, as indicated in Step A, the process commences with a P-type material wafer having a <100> crystal orientation. A first silicon dioxide ($SiO_2$) layer approximately 650 A thick is grown, for example, by flowing dry oxygen ($O_2$) over the substrate 10 in a furnace maintained at about 1000° C. for about 90 minutes (Step B). Thereafter, (Step C) a silicon nitride layer ($Si_3N_4$) is formed over the first $SiO_2$ layer. This silicon nitride layer is made approximately 1200 A thick and may be grown in a reactor by subjecting the first $SiO_2$ layer to a mixture of silane and ammonia ($SiH_4 + NH_3$) having a flow rate of about 2600 cc per minute in a furnace having a temperature of about 920° C. for a period of approximately 5 minutes. In Step D, a masking oxide layer is then grown on the nitride layer in a reactor utilizing a chemical vapor deposition method. This deposition method, typically, may be one that utilizes a mixture of silane and oxygen ($SiH_4 + O_2$) flowing at the rate of about 2000 cc per minute for approximately 3 minutes at a temperature of about 625° C. to produce a thickness of about 1000 A. At this point, as shown in Step E, a photoresist mask is applied to selected areas of the masking oxide layer in order to mask the area under which the drain, source and channel areas will appear in the substrate. The unmasked areas will represent the regions on which field oxide will be grown, as will be subsequently described.

To accomplish the growing of the field oxide it is now necessary to selectively remove the unmasked portions of the layers of masking oxide and silicon nitride as indicated in Step F. As an initial step, the unmasked portions of masking oxide layer is removed. Thereafter, the photoresist mask is removed and the previously masked portion of masking oxide layer now acts as a mask to facilitate the removal of the unmasked portions of the Silicon Nitride and first oxide layers.

The growth of the field oxide of Step G may be accomplished, for example, in accordance with the method set forth in the article by F. Morandi entitled "Planox Process Smooths Path to Gate-MOS Density", appearing in the Dec. 20, 1971 issue of Electronics.

In Step H, the previously masked layers of masking oxide, silicon nitride, and first oxide are now removed by etching, in order to open a region of the semiconductor wafer which represents the area where the gate, source and drain of the device will be formed. The steps just described were those necessary for the formation of the field oxide which, due to the oxidation process, undesirably formed a layer of field oxide on the reverse side of the wafer.

The next step in the process is indicated in Step I wherein a gate oxide layer is grown over both the field oxide layer and the gate areas previously opened in Step H. This gate oxide may be grown at a temperature of about 1000° C. utilizing dry oxygen ($O_2$) flowing at the rate of about 2600 cc per minute for approximately 150 minutes. Thereafter, as indicated in Step J, a polysilicon layer, having a thickness of approximately 4000 A, is deposited on the obverse side of the wafer, in a reactor, by a chemical vapor deposition method at approximately 700° C. utilizing Silane ($SiH_4$) flowing at the rate of about 2000 cc per minute for about 3 minutes.

At this stage of the processing, the obverse side of the wafer contains discrete areas on which gate regions will be subsequently formed as well as contiguous regions in which drain and source lines will be diffused. These regions, together with the intervening regions in which the field oxide has been grown, are covered with a gate oxide which, in turn, is covered with a layer of polysilicon. However, the undesirable layer of field oxide (as well as some gate oxide) has been formed on the reverse side. In accordance with our invention, seven (7) parts of Ammonia Fluoride ($NH_4F$) and one (1) part of Hydrofluoric Acid (HF) are mixed to form a dilute etchant and the entire wafer is immersed in the etchant and maintained therein for a period of about 10 to 15 minutes at room temperature to remove all traces of the oxide on the reverse side of the wafer (Step K). This may be accomplished without damage to the obverse surface due to the presence of the polysilicon layer which acts as an unetchable barrier to the weak HF etchant.

The processing may now be completed, as indicated in Step L where a masking oxide layer is grown over the polysilicon layer, in a reactor, using dry Oxygen flowing at the rate of about 3000 cc per minute at a temperature of about 1000° C. A photoresistive mask is then deposited on selected areas of the masking oxide layer to define the area to be protected from subsequent etching steps and which represents the gate region.

Thereafter, the silicon gate process requires that the unmasked portions of the masking oxide layer, as well as those unmasked portions of the polysilicon layer be etched or otherwise removed together with any thin, gate oxide layer which appears under the unmasked portions of the photoresist to thus define the regions where the source and the drain will be located. Once the excess portions of polysilicon and masking oxide layers have been removed, the device is then subjected to an atmosphere of phosphorous oxychloride flowing at the rate of about 15 cc per minute and oxygen flowing at the rate of about 300 cc per minute, together with a carrier gas of dry nitrogen flowing at the rate of about 2500 cc per minute in a furnace at approximately 900° C. for about 20 minutes in order to diffuse or dope the exposed areas of the wafer in order to form the source and drain lines.

Upon completion of these steps, a lightly doped oxide layer is deposited over the field oxide layer as well as over the gate region consisting of gate oxide and doped polysilicon layers. The doped oxide layer may be formed in a reactor at about 450° C. using a mixture of silane and oxygen ($SiH_4 + O_2$) flowing for about 20 minutes to produce a layer of about 8000 A. Thereafter, a photoresist mask layer, having open areas, is deposited thereover and the open areas, when a suitable etchant has been applied thereto, form the contact openings for contacting the drain, polysilicon gate electrode and source areas respectively. An Aluminum layer may then be sputtered over the entire device to a thickness of about 15,000 A after which it is coated with photoresistive material having openings therein for the subsequent etching of the Aluminum layer. Upon etching the Aluminum, certain areas are opened, down to the lightly doped oxide layer, to provide the required electrical isolation between conductors.

This completes the processing of the wafer and all that remains is to scribe and dice the wafer to form the individual chips (Step M) and to mount the chips on a substrate (Step N) in order that the chip may be packaged.

While we have described specific processes, including times, temperatures and concentrations, for the processing of the various layers, we do not wish to be limited to the specific processes. It will be obvious to those skilled in the art that various other processes may be used with our invention without departing from the inventive concept contained herein.

What we claim is:

1. In a method of processing a semiconductor device on the obverse side of a wafer wherein the device includes an electrode on the obverse side of the wafer, the improved process wherein an oxide layer formed on the reverse side of the wafer is removed prior to formation of the electrode and comprising:

partially forming the device on the obverse side of a semiconductive wafer, including the step of growing a layer of oxide on selected portions of the obverse side of the wafer, the oxide being simultaneously undesirably grown on the reverse side of the wafer;

providing a layer of etch resistant material on the layer of oxide on the obverse side of the wafer, the etch resistant material being suitable for forming a device electrode therefrom;

selectively etching the oxide from the reverse side of the wafer prior to the formation of the electrode; and forming the layer of etch resistant material into an electrode.

2. The process of claim 1, wherein the step of growing the layer of oxide comprises:

growing a first layer of field oxide on the selected portions of the obverse side of the wafer; and growing a layer of gate oxide over the entire obverse side of the wafer, the gate oxide simultaneously grown on the reverse side of the wafer.

3. The process of claim 2 wherein the etch resistant material is a layer of polysilicon and the polysilicon layer is formed to an electrode over the gate oxide.

4. The process of claim 1 wherein the oxide is removed solely from the reverse side of the wafer by immersing the entire wafer in an etchant comprising:

(a) 7 parts $NH_4F$ and (b) 1 part HF; and wherein the etchant is at room temperature; and the wafer is maintained in the dilute etchant for a period of about 10–15 minutes.

* * * * *